United States Patent [19]
Garziera

[11] 4,079,447
[45] Mar. 14, 1978

[54] STORED PROGRAM ELECTRONIC COMPUTER

[75] Inventor: Gastone Garziera, Ivrea (Turin), Italy

[73] Assignee: Ing. C. Olivetti & C., S.p.A., Ivrea (Turin), Italy

[21] Appl. No.: 460,269

[22] Filed: Apr. 11, 1974

[30] Foreign Application Priority Data

Apr. 24, 1973 Italy .................................. 68155/73

[51] Int. Cl.² .............................................. G06F 9/06
[52] U.S. Cl. ................................................ 364/200
[58] Field of Search ....................... 340/172.5; 444/1; 364/200 MS

[56] References Cited

U.S. PATENT DOCUMENTS

| | | | |
|---|---|---|---|
| 3,348,211 | 10/1967 | Ghiron | 364/200 |
| 3,544,975 | 12/1970 | Hunter | 340/172.5 |
| 3,568,158 | 3/1971 | Haller et al. | 364/200 |
| 3,585,600 | 6/1971 | Saltini | 364/200 |
| 3,660,825 | 5/1972 | De Sandre | 364/200 |
| 3,693,162 | 9/1972 | Spangler | 364/200 |

*Primary Examiner*—Raulfe B. Zache
*Attorney, Agent, or Firm*—Schuyler, Birch, Swindler, McKie & Beckett

[57] ABSTRACT

A method and apparatus for use in electronic computer for altering a stored program. The deletion of an instruction from a main memory storing it results in a compression of the program that included the deleted instruction in order to conserve memory space. The insertion of an instruction in a program stored in a main memory results in the shifting of subsequent instructions stored therein. The memory may be divided into arbitrary sections in response to an instruction enabling the search of a particular subroutine to be shortened. The subroutines in the program which can be reached each have a corresponding program level register. At each subroutine jump instruction the contents of the program level registers are shifted up in order to save the current program level register contents.

5 Claims, 13 Drawing Figures

FLOW OF MACHINE STATES

STORED PROGRAM ELECTRONIC COMPUTER

BACKGROUND OF THE INVENTION

The present invention refers to an electronic computer provided with a stored program in a memory, and comprising a plurality of peripheral units.

The execution of the program stored in the memory is carried out in known devices without breaking the sequential order of the invention. This order is broken only for the execution of conditioned jump instructions. The conditioned jump instructions take place in some embodiments when certain processing results are attained the later being arranged so as to be checked before the actual jump is executed. If the result is negative the jump is not carried out and the skipping of the actual jump is executed.

Sub-program jumps produce the storing of a re-entry point: by transferring the contents of a program counter into an auxiliary register, the last instruction restablishing the re-entry address by carrying out the reverse transfer operation from that of the auxiliary register into the program counter.

In the event that the same address is entered again from a plurality of sub-programs, the programmer is compelled to program in known devices some new condition analysis and, therefore, other jumps depending upon which sub-programs have been executed; in this way the speed whereat the device is allowed to operate is severely limited.

SUMMARY OF THE INVENTION

This and other limiting conditions are obviated by the computer according to the invention, wherein among the particular executable instructions is one concerning the re-entry from the sub-program into the main program, comprising the shifting of the variable number of instructions sequentially arranged on the main program.

This and other characteristics of the invention will become apparent from the following description of preferred embodiments made by way of example and not in a limiting sense, by means of the aid of the accompanying drawings.

DETAILED DESCRIPTION OF THE PREFERRED EMBODIMENT

General Description

Figure 1:
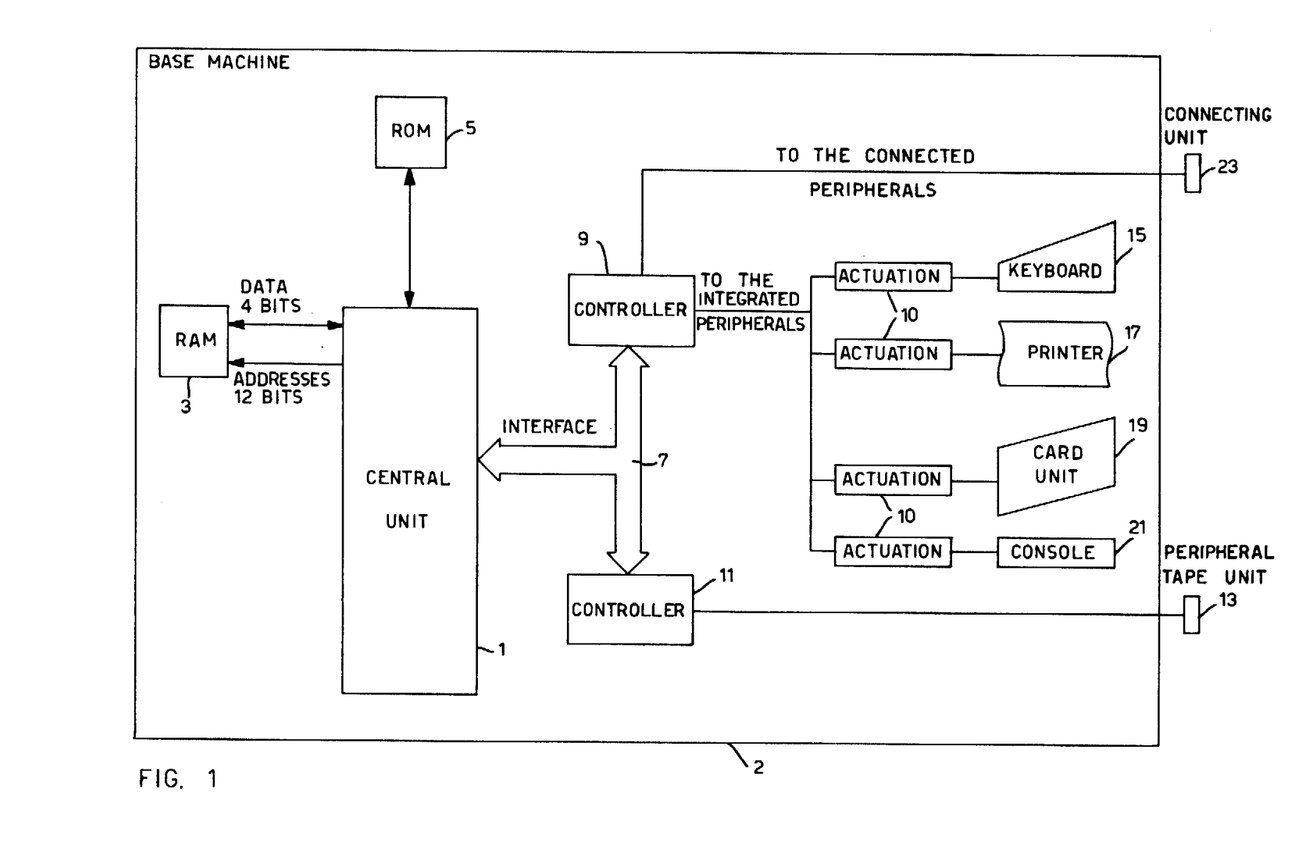
FIG. 1 is a block diagram of the computer according to the invention.

FIG. 1 shows a computer constituted essentially by a base machine 2. The machine 2 comprises a central unit 1 adapted to control, in the manner which will be described hereinafter, the processing of the data and the flow thereof between the other units of which the computer in composed. The machine 2 moreover comprises a random access read/write memory 3, labelled the RAM, adapted to store data and instructions to be utilized in successive processing operations. The machine 2 furthermore comprises a read-only control memory 5, hereinafter called in ROM, adapted to store the microprograms controlling the elementary machine operations.

The central unit 1 is moreover connected through a channel 7 to two control units 9 and 11. The controller 11 controls in known manner the exchange of information between the central unit 1 and a peripheral magnetic tape unit 13 and is of known type. The controller 9 is adapted to control the exchange of information between the central unit 1 and a group of peripherals 15, 17, 19 and 21 each controlled by a corresponding group of actuating circuits 10.

More particularly, the peripheral 15 is an alphanumeric keyboard, the key arrangement of which is of the type described in U.S. Pat. No. 3,692,167 in the name of Teresio Gassino. The peripheral 17 is an alphanumeric serial printer, for example of the type described in U.S. Pat. No. 3,651,916 in the name of Raffaele Becchi. The peripheral 19 is a read/write unit for magnetic index cards, of the type described in U.S. Pat. No. 3,495,222 in the name of pier Giorgio Perotto and Giovanni De Sandre.

The peripheral 21 is a command console of a type known per se and therfore not described in detail. It comprises substantially function pushbuttons and indicators which define the operative state or order of the machine. One pushbutton, called, for example, the "Record Program" pushbutton, defines that an instruction tapped out on the keyboard must not be executed but is to be loaded into the RAM 3. Another pushbutton, called the "Single Step" pushbutton, defines the execution step by step of the program, which then stops after each instruction carried out. This is then printed by the printer 17.

Other peripherals such as a plotter, measuring instruments, an auxiliary printer and a diagnostic apparatus may be connected to the central unit through a connecting unit 23.

The RAM 3 is a read and write memory, comprising semiconductors, i.e., produced by MOS technology and having a preferred maximum capacity of 4096 locations, each location being composed of four bits sufficient to represent a numeric character from 0 to 9. The RAM 3 (FIG. 2) is constituted by 16 MOS chips $14_0$, $14_1$ ... $14_{15}$ grouped in four groups. These are disposed physically in four superposed planes. More particularly, each group includes one chip from each plane and to the 1st group there belong the chips $14_0$, $14_4$, $14_8$, $14_{12}$, to the 2nd group there belong the chips $14_1$, $14_5$, $14_9$, $14_{13}$, and so on for the other groups. Each chip contains 1024 bits disposed in a square grid of 32 positions per side. A 4 bit character is stored at four like positions of the four chips in a group.

Figure 2:
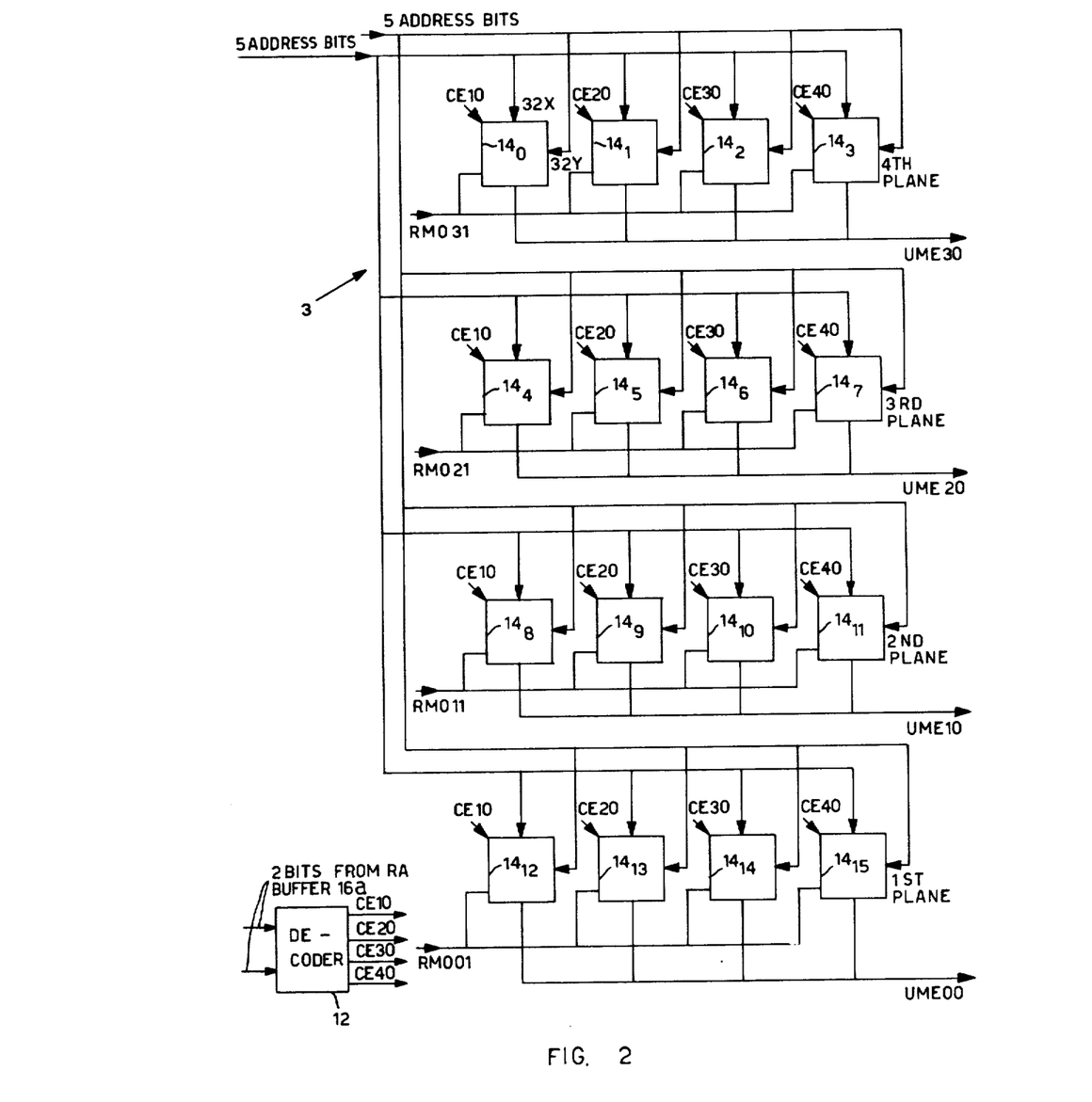
FIG. 2 is a block diagram of a computer memory.

To address a memory location of the RAM 3, twelve bits are therefore necessary: 5 + 5, indicated in FIG. 2 as "address bits," identify a point of the 32 × 32 grid of all the chips, and another 2 bits arrive at a decoding circuit 12 known per se and are decoded, generating four pulses called CE 10, CE 20, CE 30, CE 40. These four pulses are applied to the chips of the corresponding group and identify, in the four planes simultaneously, the group of chips 14 concerned. The RAM 3 provides a parallel output of four bits called UME 00, UME 10, UME 20 and UME 30 and writes in parallel input of four bits called RM001, RM011, RM021 and RM031. The outputs UME are rendered active in the absence of a writing enabling signal, while the inputs RMO are rendered active by the presence of the writing enabling signal. This signal is emitted by a suitable circuit known per se included in the central unit 1 (FIG. 3) in a sequence network 24 thereof, as a function of the reading or writing instruction which it is desired to carry out.

The individual characters of the RAM 3, which are formed by 4 bits, are grouped in turn in groups of 15 to form 60-bit, 15 character registers. In the whole of the RAM 3 there can thus be identified 240 registers usable for containing numeric data or instructions of the user. The division of the individual registers serves for floating point representation of the numeric data.

More particularly, a generic numeric datum is represented by a mantissa or fixed point part of 12 characters, an exponent of two characters and four bits, the first of which represents the algebraic sign of the exponent and the last that of the fixed point part.

Table 1 shows an example of floating point representation of the numbers 0.0004951627 and −29,841,630.2051.

TABLE 1

| NUMBER | REPRESENTATION IN MEMORY | | |
|---|---|---|---|
| | FIXED POINT PART | EXP. | SIGNS |
| 0.0004951627 | 495162700000 | 03 | 1000 |
| −29,841,630.2051 | 298416302051 | 08 | 0001 |

$$1 = - \begin{cases} \text{sign EXP.} \\ \text{sign FIXED POINT PART} \end{cases}$$
$$0 = +$$

Instead of a numeric datum, each register of the RAM 3 may contain five program instructions, each of which has a length of 12 bits. The instructions are composed basically of two fields: one which represents the operation to be effected is called the "Function code," while the other which identifies the register on the contents of which it is desired to operate is called the "Operand." Sometimes, in jump instructions inserted in a program to break the normal sequence of execution, the operand indicates the memory location starting from which the next instruction to be carried out will be found. As will be seen hereinafter, these instructions are compiled by the operator on the keyboard 15 (FIG. 1) by means of a combination of numeric and function keys.

The ROM 5 (FIG. 1) is a read-only control memory constituted by 12 MOS chips. Permanently recorded therein are the microinstructions which permit the execution of the keyboard instructions and produce the exchange of data between the various parts of the base machine 2 in accordance with the technique of microprogramming. Since each chip of the ROM contains 4096 bits and each microinstruction has a length of 16 bits, the maximum number of microinstructions which the ROM 5 can contain is 3072. The ROM is divided into six "pages," each comprising 512 microinstructions. The microinstructions are addressable by means of 12 bits: three to select the "page" and nine to select the microinstruction from among the 512 possible in the "page."

The set of microinstructions is founded upon 35 different possible machine microoperations: these can be formed into six groups:
1) Exchange of data between the central unit 1 and the RAM 3 and between the ROM 5 and the RAM 3
2) Arithmetical operations
3) Logical operations
4) Transfer operations
5) Interface operations
6) Jumps.

CENTRAL UNIT

The central unit 1 (FIG. 3) comprises a service or temporary memory 16, which will hereinafter also be called the S.P. (Scratch pad). This contains information frequently required for intermediate processing results, so as to avoid continuous access to the RAM 3, which has a memory cycle twenty times greater than the cycle of the memory 16. The latter is preferably constructed with bipolar integrated circuits: this enables speeds greater than those obtainable with MOS integrated circuits to be obtained.

Figure 4:
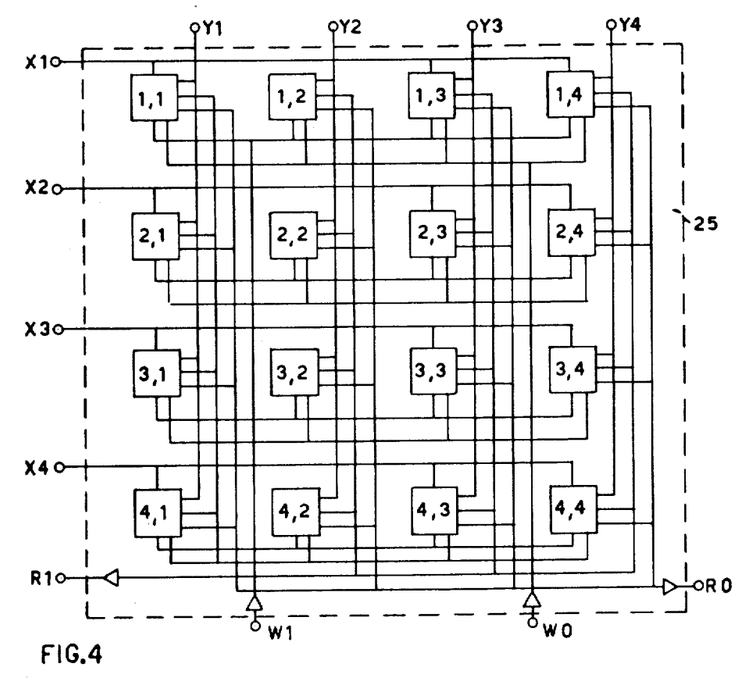
FIG. 4 is a diagram of a memory package.

The S.P. 16 is composed of sixteen registers RO . . . R9, RA . . . RF. These registers each carry 12 bits available in parallel and disposed in 12 packages, each indicated by the reference 25 and constructed as shown in FIG. 4. Each package 25 contains 16 bits, which are the corresponding bits of the registers R0 . . . R9, RA . . . RF. For example, the first package contains all the first bits of the 16 registers: the second package contains all the second bits of the 16 registers and so on as far as the twelfth package which contains all the twelfth bits of the 16 registers. Four bits are sufficient for addressing the registers of the S.P. 16.

There is moreover the possibility of arranging the twelve packages in three groups of four: to the first group, also called S.P. Col. 1 (FIG. 3), there belong the four packages containing the first four bits of the 16 registers, to the second group, or Col. 2, and Col. 3 there belong the four packages containing the second four bits of the 16 registers, and so on. Thus, three S.P. columns are identified. In each single column there are always 16 different addressing possibilities and, therefore, sixteen registers this time with a parallelism of 4 bits. In the three columns, then, there are 48 registers in all with a parallelism of four, for the addressing of which 6 bits are required.

The usefulness of having both 4-bit registers and 12-bit registers in the S.P. memory 16 is the possibility of accommodating both 4-bit data coming from the RAM 3, to be retransmitted to the RAM 3 after being processed, and 12-bit addresses of the RAM 3 or the ROM 5.

Of the 16 12-bit registers of the S.P. 16, mention is merited by the first four, R0, R1, R2, R3, of which R0 always contains the current address of ROM 5, which is automatically increased by 1 at each microinstruction which is read, R1 contains constants sent by the ROM 5, R2 contains 12 switching elements, each of one bit, R3 contains the address of ROM 5 during the execution of a conditional jump microinstructions.

The contents of these registers are automatically transferred to the registers R8 . . . RB, respectively, during the stages of initialization of the system which are started by pressing a RESET pushbutton known per se included in the keyboard 15 (FIG. 1).

There is moreover a fourth column in the S.P. (FIG. 3), which is constituted by a single register SO2 consisting of four bistable flip-flops C, D, E, F. The register SO2 can be addressed by using only two bits necessary to identify the column of flip-flops C, D, E, F, since the register SO2 is the only one in the column. The flip-flops C, D, E, F are used as switching elements and are set according to quantitative results of a number of microinstructions, such as, for example, a number different from zero, a binary carry higher than 15, a binary carry higher than 4095, a binary number greater than 9.

The outputs of the S.P. 16 are connected to a reading or buffer register 16a composed of twelve bipolar flip-flops and which, in addition to storing the data output by the S.P. 16 and which is to be processed, serves as a channel for the data output by the central unit 1 to the peripheral units and to the RAM 3. Moreover, the buffer 16a may contain the address of the RAM 3 or alternatively the current address of the ROM 5.

Figure 7:
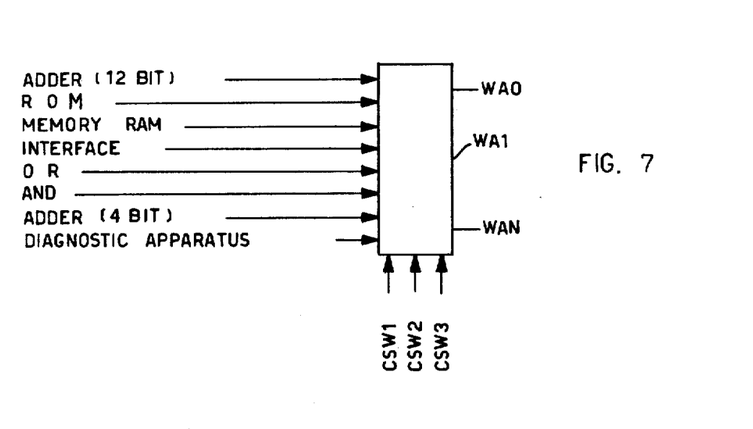
FIG. 7 is an example of a multiplexer circuit used for recording in the memory.

The central unit 1 moreover comprises a writing network 16b at which there arrives the data which, after being processed by the arithmetic and logic unit, must return to the S.P. 16, or the data which enter the S.P. 16 from the peripherals, or from the RAM 3, or from the ROM 5. The network 16b is constituted by 12 like multiplexers, one per bit, of which only one WA1 is shown in FIG. 7. Each multiplexer has eight inputs selectable by three commands CSW1 to CSW3 of the central unit 1, and two outputs WAO, WAN, one direct and one negated.

Figure 8:
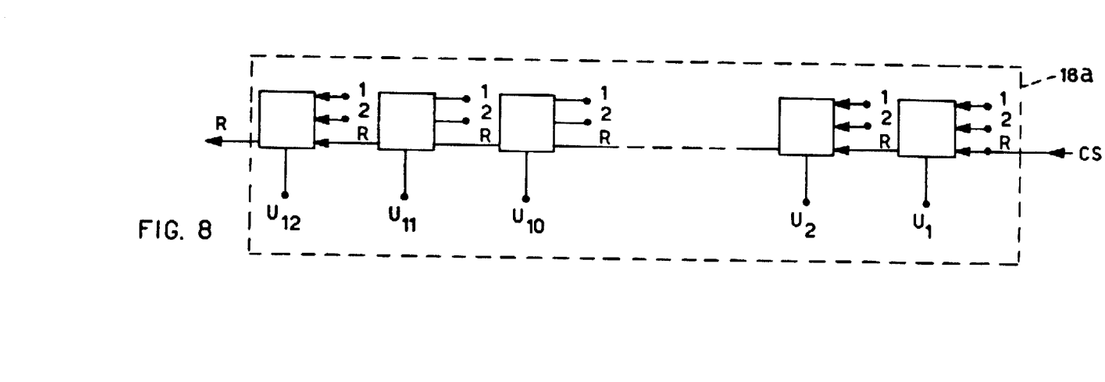
FIG. 8 shows an adding circuit of the central unit.

The central unit 1 (FIG. 3) moreover comprises an arithmetic and logic unit 18 constituted by an adder 18a (FIG. 8) having twelve cascaded stages U1 to U12 and of a type known per se, each of which is capable of executing an addition on 3 bits at a time. Two inputs 1, 2 of each stage are supplied with the bits to be added, the third R serves for the possible carry bit and forms the connection between the various stages of the adder. That is to say, the carry output of a certain stage constitutes the carry input of the following stage. The first stage receives at its input R a command CS from the central unit 1 which is equivalent to the presence of a 1 bit at the input R.

Figure 3:
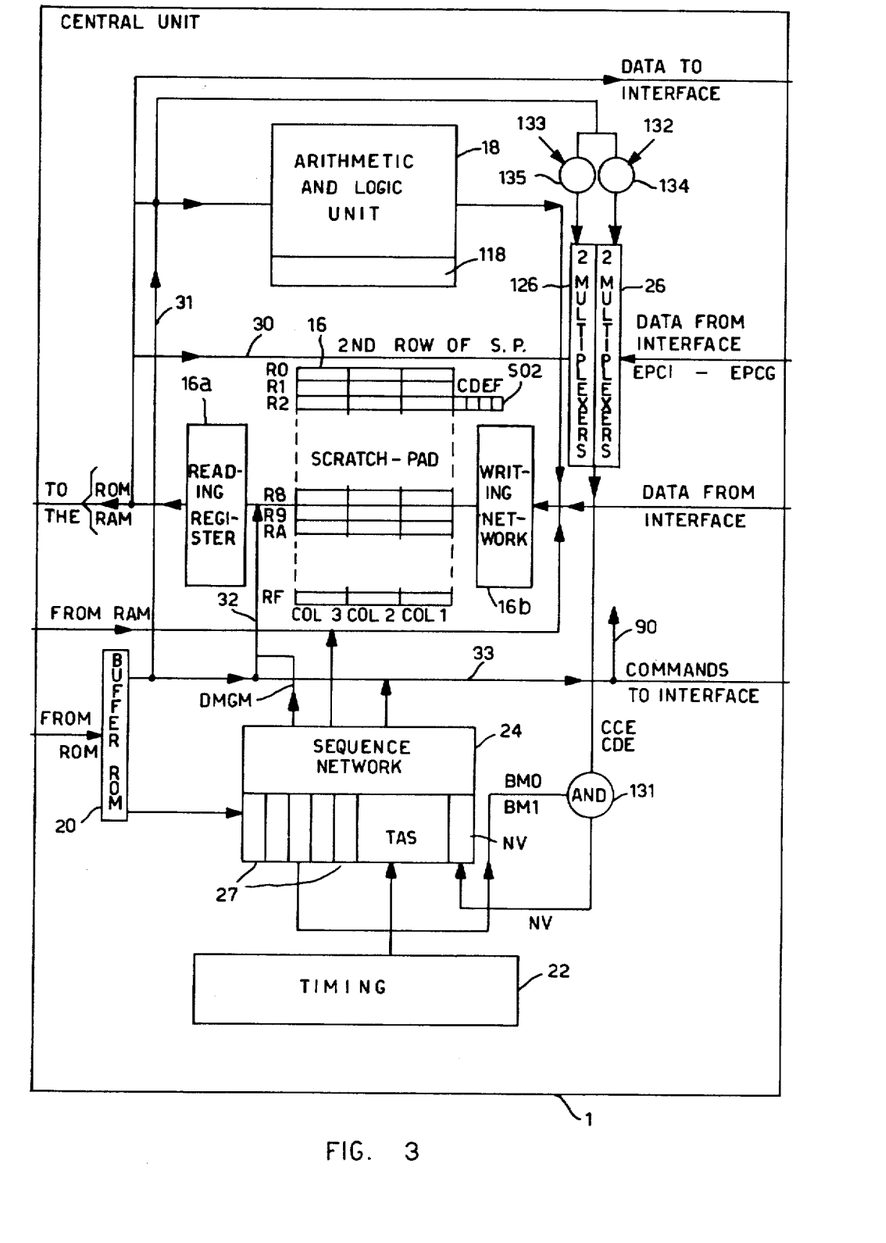
FIG. 3 is a block diagram of the central unit.

The adder 18a may be used as a 4-bit parallel adder, utilizing the outputs U1, U2, U3, U4 of the first four stages,, or as a 12-bit parallel adder, utilizing all the outputs U1, U2, U3 ... U12, respectively, for the additions on data and for the additions on addresses. The 12-bit outputs of the adder 18a constitute one of the inputs of the multiplexers Wa1 to WA12 (FIG. 7) of the writing network 16b of the S.P. 16 (FIG. 3). The 4-bit outputs of the adder 18a constitute another of the inputs of the multiplexers WA1 to WA4 (FIG. 7) of the network 16b.

The unit 18 moreover comprises a logic network 118 (FIG. 3) known per se which performs the logical AND, NAND, OR and exclusive-OR functions between two 4-bit characters. The outputs of this logic network 118 constitute the two inputs AND and OR of WA1 (FIG. 7) and therefore of the S.P. 16 (FIG. 3).

The central unit moreover comprises a 16-bit register 20 hereinafter called the ROM buffer 20. This in a register contained in the central unit 1 which has output buffer functions for the microinstructions contained in the ROM 5. Each microinstruction follows a cycle in which, before being executed, it must be extracted from the ROM 5 at the address indicated by the first register RO of the S.P. 16, this address being incremented by 1 immediately afterwards, upon a command from the central unit 1. The register 20 receives the microinstruction in the 16-bit format, which is common to all the 35 possible microinstructions.

Figures 10, 12:
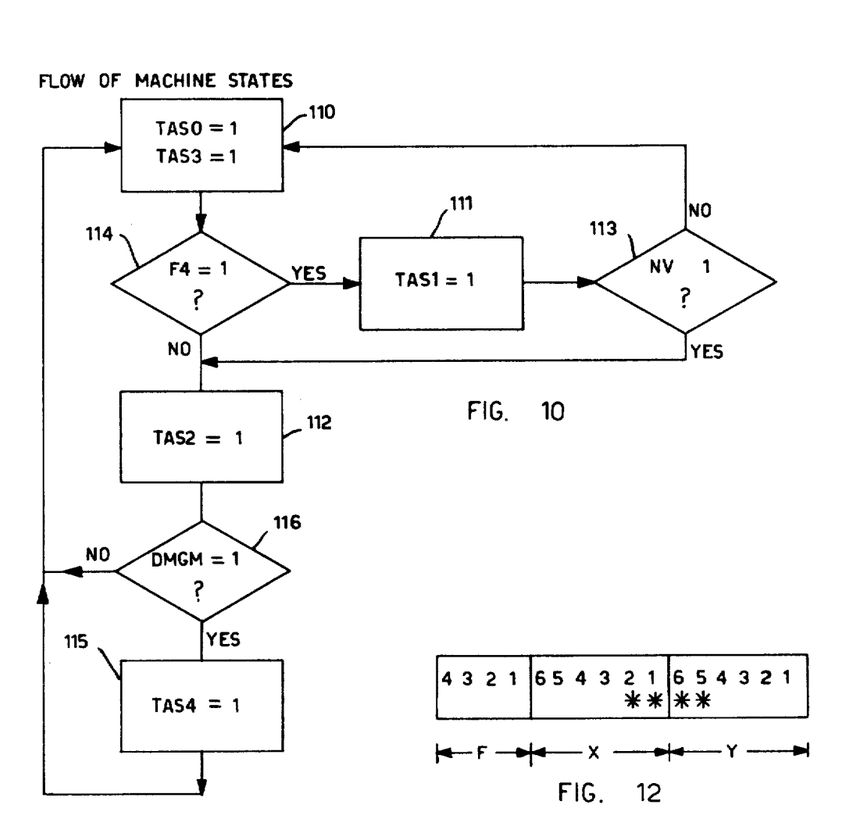
FIG. 10 is a flow chart of the machine states.
FIG. 12 shows the format of a microinstruction.
Figure 11:
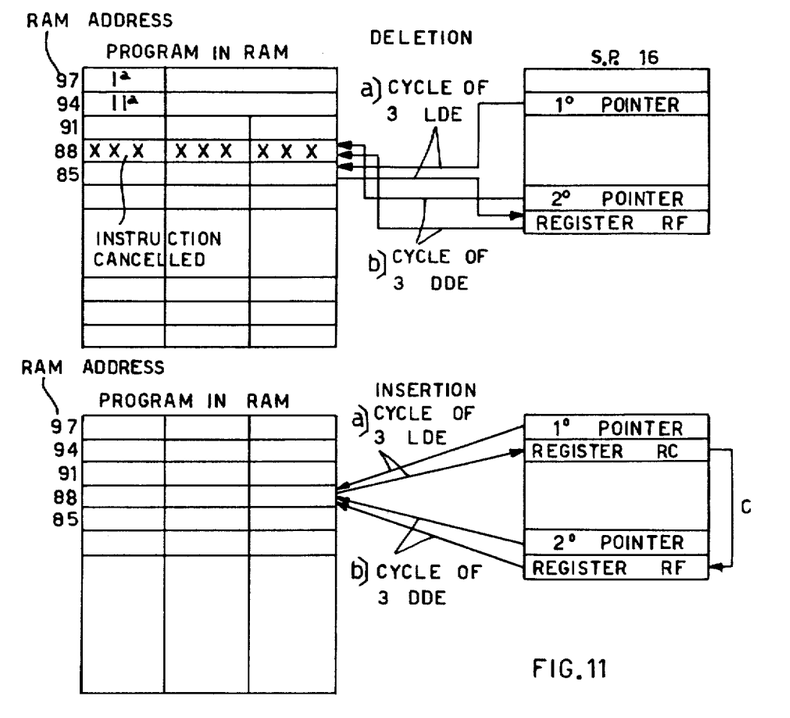
FIG. 11 is a diagram showing the program correction method.

In the common format, the 16 bits of the microinstruction are assembled in three fields F, X, Y (FIG. 12). The first field F, consisting of four bits, serves to identify the function code, the second field X consisting of six bits generally serves to address a first operand in the S.P. 16, and the third field Y consisting of another six bits generally serves to address a second operand (4-bit registers) in the S.P. 16. Since the field F alone enables 16 possible microinstructions to be represented with its four bits, the remaining 19 microinstructions of the 35 different ones possible are represented by making use of two bits of the field X or Y which are marked with an asterisk in FIG. 12. In these cases, the remaining bits of the field X or Y are always sufficient for addressing the first and second operands, respectively, contained in two 12-bit registers of the S.P. 16.

In some jump microinstructions, the operand constituting the address is the only one and is formed by the fields X and Y together, which identify the configuration of all the twelve bits of the address.

The central unit 1 (FIG. 3) comprises a sequence network 24 adapted to generate combinatory-logic signals, called central unit commands, which ensure correct carrying out of a microinstruction. This network 24, of a type known per se, receives as input the decoded results obtained from the information coming from the ROM buffer 20 and arranges them from the time point of view, making use of the machine timing established by unit 22. These commands serve, for example, to enable the passage of information, to take logical decisions, to select data, to update addresses.

A set of five decoders 27 of a type known per se effects the main decoding operations appertaining to the microinstructions. The inputs of the five decoders 27 receive the bits of the field F and of the field X, Y (FIG. 12) of the buffer 20.

Finally, the central unit 1 (FIG. 3) comprises a first pair of multiplexers 26, each having eight inputs, which are connected to the interface 7 (FIG. 1) and are adapted to receive signals indicating the state of the peripherals, and a second pair of multiplexers 126 (FIG. 3) having eight inputs, which are connected to the reading register 16a and adapted to receive the information recorded in a particular register of the S.P. 16. The multiplexers 26 and 126 are of known type and each of them has an output connected to an AND circuit 131 which also receives a signal emitted by the decoder 27 and indicating the particular microinstruction which is being executed. Moreover, each of the multiplexers 26 and 126 has four selection inputs connected to two AND circuits 134 and 135, respectively, for receiving as many selection signals. Of these one selects one of the two multiplexers of each pair and the others select the input which it is desired to poll.

The exchange of information between the central unit 1 (FIG. 1) and the controller 9 of the peripherals is ensured by a series of interface signals generated by the controller 9 of the peripherals or by the central unit 1. Among the signals generated by the controller 9 of the peripherals there appear sixteen external conditions EPC1 ... EPC9, EPCA ... EPOG which reveal particular machine conditions (that is, for example, one of the pushbuttons of the console 21 depressed, or one of the keys of the keyboard 15 actuated) and are sent to the inputs of the two multiplexers 26.

Figure 5:
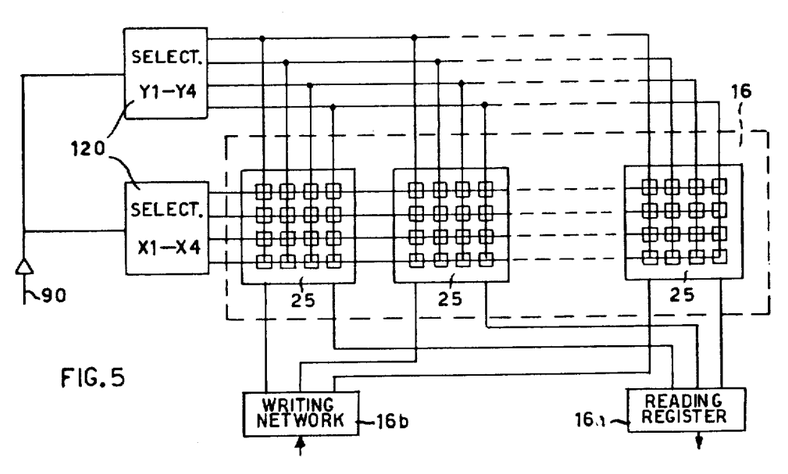
FIG. 5 is a complete diagram of a computer memory.

Referring to FIG. 3, the output of the ROM buffer 20 (FIG. 3) which is concerned with the signals of the fields X and Y of the microinstructions varies according to the various microinstructions which are extracted from time to time from the ROM 5 and buffered in the ROM buffer 20. More particularly, while the four bits of the field F of the microinstructions interact with the sequence network 24 (decoder 27 and register TAS), the six bits of the field X and the six bits of the field Y of the microinstructions have the following possible outputs determined by enabling signals of the sequence network 24 which are not shown in FIG. 3:

a) along a connection 31, to the arithmetic and logic unit 18, for the addition microinstructions and for those logical microinstructions which execute logical additions or functions;

b) along a connection 32 to the output register 16a of the S.P. 16, which is previously zeroized, for the microinstructions which interact with the memory RAM 3;

c) along the connection 33 to the interface, for the microinstructions which command the sending of signals to the peripherals;

d) along the connection 90 to a selection network 120 (FIG. 5) known per se, for the coordinates X1 ... X4, Y1 ... Y4 of the S.P. 16, for the microinstructions which process the contents of a register of the S.P. 16.

MACHINE TIMING AND STATES

The machine timing is produced by a sequential logic network 22 (FIG. 3) included in the central unit 1, which causes the commands of the central unit 1 to have duration characteristics such as to stabilize various states or cycles of the machine. Five different states may occur, these being called generally TAS in FIG. 3, and TAS0, TAS1 ... TAS4 in FIG. 10. To each of these there corresponds a homonymous flip-flop which remains set for the duration of a cycle time. The five flip-flops are in the sequence network 24 (FIG. 3) and make up a register TAS in which the present information is a function both of the preceding information and of the information of the ROM buffer 20.

Figure 9:
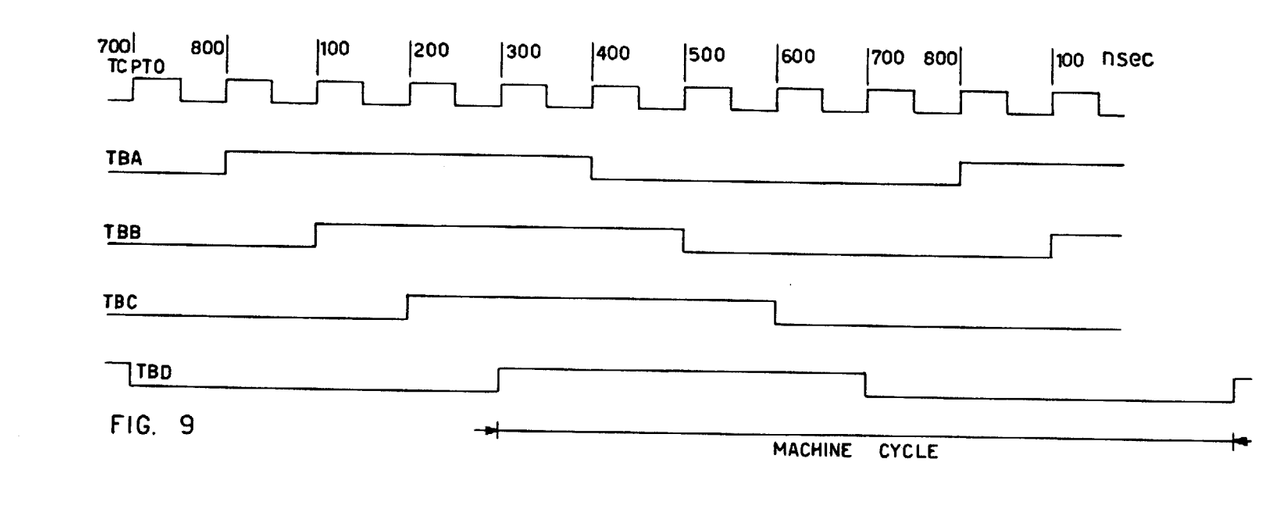
FIG. 9 is a timing diagram.

The timing logic network 22 comprises a quartz oscillator which generates a waveform TCPTO (FIG. 9) with a period of about 100 nanosecs. This is sent to a counter formed by four J-K connected flip-flops, so that there is obtained as output four waveforms TBA ... TBD with a period eight times larger, that is of about 0.8 microsec. The various timing signals are indicated in FIG. 9. The period of the output signal TBD identifies the machine cycle.

To initiate a processing operation, the usual RESET key is pressed and puts the central unit 1 into a processing-commencement or start-awaiting state in a manner known per se. In normal operation, during the machine state defined by TAS0 and TAS3, simultaneously at 1 (state 110 in FIG. 10), the microinstruction is read from the ROM buffer 20 and interpreted. During one or two states among the different states TAS1 — TAS2 — TAS4, the microinstruction is executed; each microinstruction is therefore executed in a time which is a multiple of the machine cycle by means of a corresponding sequence of microoperations. The last microoperation carried out is, however, always the return to the states TAS0 — TAS3 of reading of the next microinstruction, the address of which is in the first register RO of the S.P. 16 (FIG. 3) updated by the central unit during the preceding reading stage.

A flip-flop NV of the sequence network 24 is connected to the AND circuit 131 and serves to exert an influence on the sequence of the register TAS, as will be seen better hereinafter.

Passage from one machine state to another takes place with the consent of the timing network. After the stage 110 of reading from the ROM 5 and of interpretation of the microinstruction, the machine passes to the state TAS1 (stage 111 in FIG. 10) if the bit of greater weight of the microinstruction code F4 is 1; otherwise, the machine passes to the state TAS2 (stage 112). In the first case, through the medium of the logical decision 113, the machine passes to the state TAS2 (phase 112) if NV is 1; otherwise, the machine goes on directly to read the next microinstruction (states TAS0 and TAS3 = 1, that is, stage 110).

In the event of the machine having passed from the logical decision 113 to the stage 112, a microinstruction must be carried out in two stages, such as, for example, a double addressing in the S.P. 16. On the other hand, the microinstructions interrogating the RAM 3 which have the bit of greater weight F4 = 0, while being carried out in two stages, come within the alternative case of direct passage to TAS2 after the reading through the medium of the decision 114, without passing through TAS1. These last microinstructins are concluded in the state TAS4 (stage 115). In practice, the addresses are handled in the state TAS2 and the data are handled in the state TAS4.

For all the remaining microinstructions which require a single addressing of the S.P. 16, the flow of states includes the state TAS2 occurring immediately after the reading of the microinstruction. These microinstructions are exhausted in the state TAS2, the command DMGM emitted by the network 24 and characteristic of the microinstructions interacting with the RAM3 not being present. In this case, there is a return from the logical decision 116 to the stage 110.

MAIN MICROINSTRUCTIONS HANDLING THE DATA INTERCHANGE WITH THE MEMORY RAM3

The microinstruction RIN (Read and Increment) reads the memory RAM3 at the address contained in the register R of the SP 16 identified by the operand Y in the register S of the SP 16 identified by the operand X, and increases the address by 1.

The microinstruction SIN (Store and Increment) stores in the memory RAM3 the contents of the register S of the SP 16 identified by the operand X, at the address stored in the register R of SP 16 identified by the operand Y, and increases the address by 1.

The microinstruction LDE (Read and Decrement) reads the memory RAM3 at the address contained in the register R of the SP 16 identified by the operand Y, in the register S of the SP 16 identified by the operand X, and decreases the address by 1.

The microinstruction DDE (Store and Decrement) stores into the memory RAM3 the register S of the SP 16 identified by the operand X at the address contained in the register R of the SP 16 identified by the operand Y, and decreases the address by 1.

The microinstruction RDI (Read at Direct Address) reads the memory RAM3 at the address built up directly by the operand Y in the register S of the SP 16 identified by the operand X.

The microinstruction SDI (Store at Direct Address) stores in the memory RAM3 the register S of the SP 16 identified by the operand X at the address supplied directly by the operand Y.

The microinstruction RSP (Read the RAM3 and store in the Scratch Pad) reads the memory RAM3 at the address stored in the register R of the SP 16 identified by the operand Y, in the register S of the SP 16 identified by the operand X.

The mocroinstruction SSP (Store on the RAM3 after reading the Scratch Pad) stores the register S of the SP 16 identified by the operand X into the memory RAM3 at the address contained in the register R identified by the operand Y.

The microinstruction ADI carries out the addition between the register S of the SP 16 identified by the operand X and the operand Y.

The microinstruction ORL executes the logic function OR between the two registers RS of the SP 16 identified by the operands X and Y and writes the result into the register RS identified by the operand X. Finally, the eventual positioning of the switch DE is duly checked.

The microinstruction AND embodies the logic function AND between the registers RS of the SP 16 identified by the two operands X and Y, and writes the result into the register RS identified by the operand X. The eventual positioning of the switch DE is duly checked.

The microinstruction ANI executes the logic function AND between the register RS identified by the operand X, and the operand Y. The eventual positioning of the switch DE is duly checked.

INSTRUCTION HANDLING

It is assumed that the equipment is set up in the "Program Loading" stage characterized by the depression of the "Record Program" key located on the console 21. This causes the console to emit the signal EPCB identifying the external condition of the operated console, which signal actuates one of the multiplexers 26. In this way the storing of a set of instructions into RAM3 is thus duly preset, which is a program to be executed in the future upon the operator's request.

As said before, each register of the RAM3 that may be utilized by the operator, may contain a datum of 12 significant digits having the floating decimal point, or 5 user program instructions of 12 bits each. Generally, each program instruction includes the RAM3 register address corresponding to the datum to be processed. The instructions stored on the RAM3 follow the format that is common for all instructions, and is normally built up of 7 bits identifying the operand address being preceded by a further 5 bits identifying the operation code combination. Conversely, the operator sets up the instruction of the keyboard 15 by depressing first the operand address key and, subsequently, the operation code combination keys.

For instance, the operator may depress the key K which has the effect of directly addressing the first 100 registers of the 240 ones included in the RAM3, and subsequently the keys 2 and 3. This means that the datum to be operated on is stored in the register X 23 of the RAM3. The operator can address an operand by further depressing the key N, the effect whereof is to directly address one of the eight possible registers of the RAM3, the so called "index register," and, subsequently, one key selected among the keys from 0 to 7. Said index registers are arranged according to 4 characters of 4 bits each and may contain decimal numbers up to 9999.

The operator can also lower the key A, the affect of which is to directly address a register A of RAM3: said register having a length of 60 bits and being usable as operational register. Stored on said register is the first operand of the arithmetic instructions and it receives the result thereof. Finally, the operator can address an operand by depressing a key C, followed by an operand key selected among the numeric keys 0 to 3. This operand sets one of 4 bits in the RAM 3, these bits acting as a program switch as it will be described in more detail later.

The operator depresses the operand address keys, and immediately after this, he depresses a function key: for instance an arithmetic key +, × ... or a jump key J, SJ ... or a key L in order establish a reference along the program showing the location to where the jump is to be directed, etc. Moreover, the operator may depress two function keys; in this event the first key to be depressed is the actual function key /, the object of which is to modify the operation defined by the other key. For instance: the key L when depressed singly identifies a reference instructions or a program label; conversely, if it is preceded by the key / it is used to set a specific origin of the program in the memory RAM3 (FIG. ... ) which is different from the physical origin defined by the highest address, namely by the register 239. While the key J when singly depressed defines a jump instruction, if preceded by the key / it is used to search for a specific origin and to book or store its address on the memory RAM 3 in the booking register of the FIG. 6. From this booking register it should execute the next jumps, as it will be better explained below. It is to be noted that for setting up an instruction, up to 5 keys may be required.

The single datum of an instruction set up by the operator on the keyboard 15 is applied in a 6-bit coded form, into the register RA of the SP 16. The various data will be here grouped so as to take up a full instruction meaning compatible with the equipment circuitry, following the 12-bit format which is common for the instructions stored on the RAM3. This is carried out by a particular data conversion routine of the microprogram residing in the ROM 5. Said routine utilizes some registers and switches of the SP 16 memory. As the instruction setting up operation proceeds on the keyboard and the encoded data is progressively recognized, the microprogram conditions are stored incidental to what is set up on the keyboard. For instance, a numeric key sets a switch of the register R2 of the SP 16 (FIG. 3), and the key K sets the switch C of the register SO2 of the SP 16. In particular, the register RF of the SP 16 is adapted to store the code combination of the key 1 .

After the last key referred to in an instruction has been depressed and duly encoded, said key always being a function key, the microprogram stores the code combinations corresponding to the keys set up on the keyboard, into the register RF of the SP 16 by means of a further encoding operation so as to reach a 12-bit configuration.

The instruction having said configuration is now transferred by the microinstruction DDE, in the form of 3 groups of 4 bits each, from the SP 16 into the RAM3. In particular, when the status TAS 2 following the interpretation stage (operation 112 in FIG. 10) is reached, a command is emitted by the sequence network 24 (FIG. 3) as a response to the recognizing operation of the microinstruction DDE, which addresses the register of the SP 16 storing the RAM3 address, by means of the field Y of the microinstruction. In turn, another command of the sequence network 24 conveys said address into the RAM3 and into the adder 18a in order to decrease it by 1. The so decreased address is stored again into the register of the SP 16 where it is sensed. On the subsequent status TAS 4 (operation 115 in FIG. 10), another command is issued by the sequence network 24 which addresses, by means of the field X of the microinstruction, a 4-bit register, this register being one of the three registers building up the register RF of the SP 16 (FIG. 3), and applies its contents into the memory RAM3 at the address identified by the field Y of the microinstruction. By means of three subsequent operations referred to the microinstruction DDE, the instruction set up on the keyboard is in this way stored in the RAM 3.

The sensing operation of the instruction stored in the RAM3, where they were previously loaded, is carried out by the microinstruction LDE controlling the transfer of a 4-bit group each time (the instruction comprises 12 bits) from the RAM3 into one of the 4-bit registers making up the register RF of the SP 16. In this way three microinstructions LDE executed one after the other are required for transferring the instruction from the RAM3 into the register RF of the SP 16.

Also the microinstruction LDE is executed in two successive states, the state TAS2 following the interpretation stage, the microinstruction LDE causes the sequence network 24 to originate a command adapted to address by means of the field Y bits, the register of the SP 16 storing the RAM3 address, and to identify the 4-bit group to be sensed; another command originated by the sequence network 24 conveys the address found in the register of the SP 16 to the adder 18a and decreases it by 1. At the time of the TAS 4 state (operation 115 in the FIG. 10) the 4-bit group of the RAM3 is actually transferred from the RAM3 into the 4-bit register of the SP 16 identified by the field X of the microinstruction.

After said sensing operation, a suitable microprogram routine recognizes the first operand and then the function code combination sequentially the instruction is carried out.

Shifting of the instructions recorded on RAM3

The shifting of the program instructions stored on the RAM3 from one position to the high or low addresses of the memory RAM3, is required when one or more instructions are added or cleared in said memory. There are in fact some events where the program loaded into the memory RAM3 requires some adjusting or debugging operation in order to clear some already loaded instructions or to insert new instructions. In the event of a clearing operation the locations previously held by the erased instructions would remain empty, thus heavily decreasing the memory RAM3 capacity if the instructions subsequent to the cleared ones would not be shifted toward the higher memory addresses in order to be located in the empty positions produced by the erasing of said instructions. If all instructions showing an address being the same or lower than the loading one, would not have been shifted downwards, the insertion of some possible new instructions would overlap the instructions already located at the positions corresponding to the newly loaded ones.

The instruction shifting operation is carried out by the control of the microprogram, which basically makes use of the above-mentioned microinstructions DDE and LDE and some registers of the SP 16. Particularly, at the beginning there is disengaged the "Record Program" and then there is depressed the keyboard clearing key KB located on the keyboard 15; and then there is cleared a previously loaded instruction located on a preset address of the memory RAM3, for instance the address 88. For the sake of simplicity there has been omitted the operations the operator had to carry out in order to shift the program addresses from the value due to the last instruction loaded on the memory, to the value 88 due to the address of the instruction to be cleared. At this point in time the microprogram engages two registers of the SP 16 I shall call "1st Pointer" and "2nd Pointer." Positioned in the first register is the address 85, namely the address of the 4 bits of higher weight referred to the instruction to be shifted into the location which was left empty owing to the clearing operation. Positioned in the second register is the address 88, namely the address of the 4 bits having higher weight in relation to the cleared instruction.

The microprogram also engages the register RF of the SP 16. A first microinstruction LDE carried out by the central unit according to the mode recited above, transfers the group of 4 bits having highest weight of the instruction to be shifted upwards as located on the address 85, into the register RF of the SP 16 and decreases the 1st pointer which will thus count the number 84. A micro-instruction DDE transfers the register RF of the SP 16 onto the RAM3 on the address identified by the 2nd pointer which is thus immediately decreased. After three in cascade sequentially arranged cycles of the micro-instructions LDE and DDE, the whole instruction to be shifted is duly shifted into the location that was left empty incidental to the executed clearing operation. The empty position is now the one starting from the address 85 and the problem to fill it duly up is the task of the subsequent instruction.

The microprogram routine is thus repeated as many times as necessary until the program comes to an end. This condition is displayed by two consecutive instructions "Start Stop." Said instructions are characterised in that they are built up of 12 bits of "0:" the program will always end with two of such instructions, without considering its length, due to the fact that the memory RAM3 is fully cleared during the system initialization stage.

This process is repeated for each cleared instruction and, as the microprogram routine that carries out the clearing function comprises the program addressing increment, there exists the chance of clearing one after the other of all instructions that were first loaded onto the memory. Said program addressing increment is carried out following the normal mode: the addressing register is transferred by 4-bits groups into a register of the SP 16 by the medium of the three microinstructions LED, then the register of the SP 16 is transferred to the unit 18 where it is transferred again into the SP 16 and, then, into the RAM3.

It is now assumed that a new instruction is to be inserted into the RAM3 address which is already occupied by another instruction. The RAM3 loading operation cannot be immediately carried out but only after the following operations.

Two registers are engaged on the SP 16 which are still employed as the 1st Pointer and the 2nd Pointer; these two registers are initially loaded with the same address 88 of the shift instruction. Moreover, two further registers are employed I shall call RF and RC having the following function: the register RC stores the instruction, that was transferred therein by 3 successive microinstructions LDE, and which must be shifted in order to allow the insertion of the new instruction. The latter is stored in the meanwhile in the register RF of the SP 16 as happens for all instructions prior to be transferred into the RAM3. The three microinstructions LDE make reference to the 1st Pointer in order to identify the RAM3 address and to sense the 4 bits belonging to the instruction to be shifted.

When said 3 microinstruction cycle is completed, the new instruction to be written into the RAM3 can be transferred into the memory by means of three microinstructions DDE which make reference to the RAM3 address stored in the 2nd Pointer. At this point in time the contents of the register RC is transferred into the register RF, the two Pointers newly store the same address 85 and there is started the execution operation of the subsequent instruction starting from the address 85, which will, conversely, store in the future the instruction having formerly the address 88. The cycle is repeated until the program comes to an end.

It becomes apparent that this way of preceeding allows the insertion of also some whole sub-programs, as the operations recited above are carried out for each instruction that is to be written.

The Jumps

The memory RAM3 may store both the program instructions and the operands, comprising among the later both the data and also the address. For instance, the jump instructions which break the sequential processing order of the instructions are provided with an operand which is the address of the instruction to where the jump should be directed.

The jump instruction operation transfers said address into the register of the SP 16 which acts as program counter having the object of addressing the next instruction to be executed.

The computer here described also has another addressing method, called "by searching." This means that the jump instructions, namely the operand, may be a number corresponding to a "label" or reference instruction. In this event the jump instruction operation transfers the operand into a register of the SP 16, for instance the register RE, and searches the corresponding reference instruction on the memory RAM3. The instructions addressed by the program counter are read in one after the other in the RAM3 and conveyed into the SP 16, for instance in the register RD, and then compared in the logic unit 18 with the contents of the register RE.

These labels are inserted in the program at the jump arrival points; they are arranged as the normal instructions showing a function code combination made of five "1" bits having no operational meaning but only have the function of signalling the label presence, and comprising an operand which is the progressive reference number. For instance if the jump instruction is "3J" (namely the operator decreases the keys 3 and J of the keyboard), the operand is recognized as the "label 3" which is to be searched on the RAM 3 and from which the program execution recorded thereon is to be started.

Finally, the labels can be addressed in a indirect way according to a number from 0 to 99. For instance: setting up the instruction "I3J" on the keyboard, the jump is conveyed to the index register N3, the contents of which are employed as the label actual address. If the contents of the register N3 are 14, it would search the label 14. The label searching operation carried out by the jump instruction operation starts normally from the physical origin of the memory RAM3 (highest address). Nevertheless a different conventional memory origin may be specified in some program stages. This can be executed by the medium of a group of 8 registers of the RAM3, which are indicated by numerals 1-7 in FIG. 6 and are singly made up of 6 characters of 4 bits each; their further function is that of program level counters. The initialization microprogram originated by the RESET key clears the whole memory, thus also said 8 registers.

Three of the six above cited characters stored in the first of said registers, after the initialization operation stage, are all "0" bits, identifying in this way the lowest address of the RAM3, namely its physical origin. These three characters will be hereinafter called the "current memory origin" for all 8 program levels. Conversely, the other three 4-bit characters have the function of a program addresser initially positioned by 12 bits having all the value "0." In the course of the aforementioned program loading stage, the program addresser takes into account the address of each instruction loaded into the memory RAM3 being thus increased by 1 as duly controlled by the microinstructions RSP and ADI. When the loading operation is over, the program addresser will contain the address of the last instruction written on the memory RAM3. When the operator requires that the program should be operated starting from the first instruction, he sets up the instruction C, J on the keyboard 15. It is thus evident that, by depressing the key C without any subsequent operated key, a different effect with respect to the key C, followed by an operand key is obtained. The keyboard operation is permitted as the equipment is in the manual operation stage (the "Record Program" key of the console 21 is disengaged). The execution of such instruction causes the current memory origin to be copied in the program addresser and the equipment carries out the program starting from the beginning in the event it was loaded initially from the physical origin of the memory. More particularly, said copying operation of the current memory origin in the program addresser can be effected by a reading cycle from the RAM3 in the SP 16, under the control of the microinstruction RSP, of the 3 characters defining the current origin. This operation is followed by a writing cycle in the program addresser in the RAM3, said cycle being controlled by the microinstruction SSP, of the register SP16 which has temporarily stored said current origin, as has, for instance, the register RC. As was previously described about the reading cycle and the writing cycle, as the reading and the writing operations actually take place each time for the 4-bit groups of the 12 bits to be read or written, 3 microinstructions RSP or SSP are thus required.

After this operation, the execution of the first instruction requires that said instruction is first read in the RAM3. Furthermore, it is first required to transfer the above named addresser into a suitable register of the SP 16, for instance the register RC, which will be always addressed by microinstructions controlling the instructions sensed in the RAM3. The responsibility for this operation is with the microinstruction RSP.

Prior to the execution of each instruction, said addresser is increased by 1 in the adder 18a as controlled by the microinstruction ADI, so that as the program evolves, the addresser is always positioned on the next subsequent instruction to be read.

Figure 6:
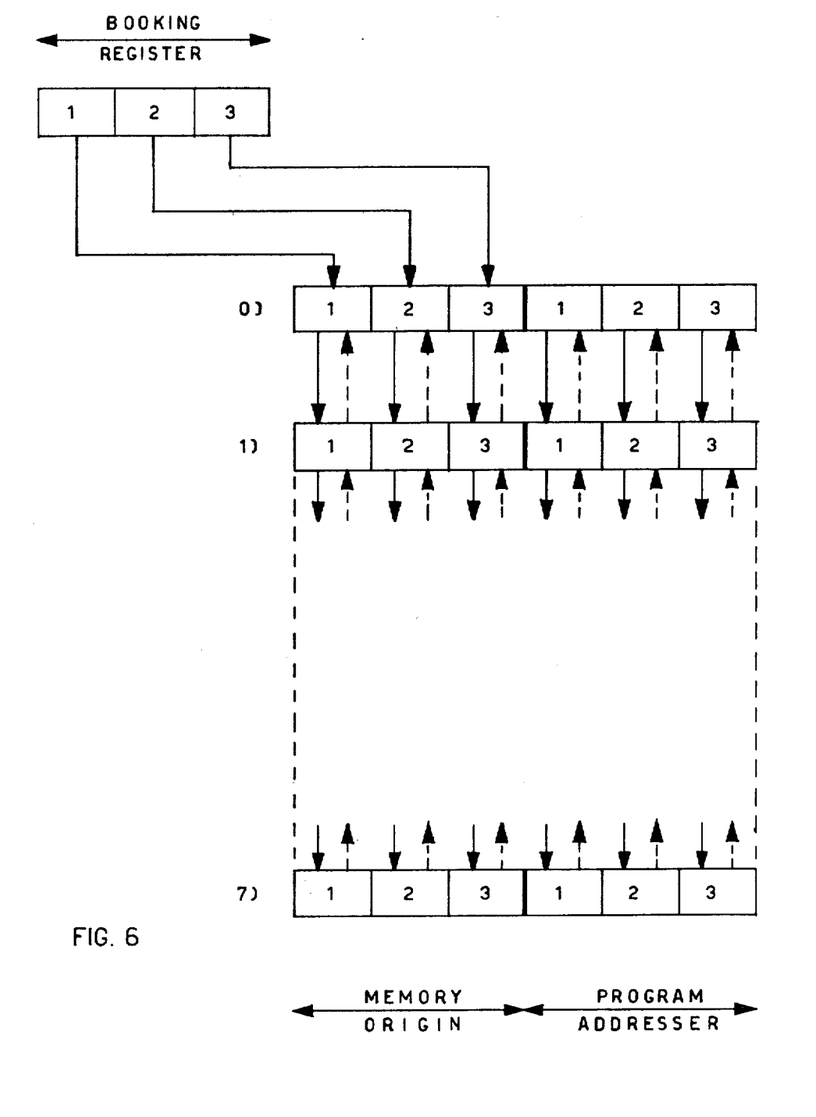
FIG. 6 is an organization diagram of a computer memory portion.

Comprised in the RAM3 is another 12-bit register which is denoted in FIG. 6 as the "booking register" wherein is set up the RAM3 address of the conventional memory origin.

The operator-programmer has at his disposal the instruction X/J capable of defining a point residing along the program which is to be considered as the convention memory origin wherein X may be an integer between 0 and 99 or the key A or the key N. This is equivalent to splitting the program into independent zones which have the chance of using the same label numbers in different program zones which are considered as separate memories. The relevant advantage is to remarkably speed up the "searching" addressings in the overall memory. For instance, the instruction A/J called "new origin booking" FIG. 13) defines the label A/L as the memory origin: the 24 J instruction being subsequent to said "origin booking" will jump to the first label 24 L subsequent to the origin A/L engaged in this way. Therefore, the instruction A/J will be carried out as a label A/L searching operation. The address of the found label on the RAM 3 is now shown by the program counter in the SP 16 and is written in the booking register by the microprogram controlled by the microinstruction SSP.

In this way an origin that is current for the time being to which makes reference the jump instruction showing a label and being preceded by an instruction identifying a memory orifin (A/J, N/J, 32/J and so forth) is distinguished from an origin booked by a booking instruction of a new memory origin which refers to the jump instruction that follow.

When a jump instruction following an origin booking instruction is carried out, the booking register is transferred to the current origin of the memory in a similar manner as a reading cycle in the RAM3 and a writing cycle in the RAM3. In this way the booked origin becomes the current origin.

Said transfer is also carried out to the program addresser so as to make the program address start evolving from the booked origin address for searching for the destination label of the jump.

A program might often require to repeatedly utilize the same instruction sequence as, for instance, for computing a function showing a plurality of parameter values. Said sequences or subprograms are recalled from different points of the main program by means of instructions SJ (sub-routine jump). This requires, in the sub-program, a label instruction for defining the sub-program starting point and a sub-program-end-instruction also identifying the re-entering address. Said address is generally always the one of the subsequent jump instruction SJ that recalled the sub-program. This is due to the fact that for the actuation of a sub-program jump instruction SJ, there is memorized both the contents of the program addresser (the instruction address SJ increased by 1) and the address of the current origin by the transferring of the program level register "0" into the program level register "1." Such transfer is carried out through two RAM3 reading cycles and two RAM3 writing cycles. The transfer is equivalent to the one carried out by the control of the microinstructions RSP and SSP as shown in FIG. 6 by the arrows denoted by the broken line.

From a sub-program a jump may be made to another sub-program by means of another instruction SJ. This will cause a second transferring operation, effected by the microprogram, of the contents of the program level register "1" to the program level register "2" and of the contents of the program level register "0" to the program level register "1."

Said mechanism will be repeated up to seven times thus producing some sub-program "nestings" of one in the other.

Every possible new origin booking is always written in the booking register (FIG. 6) and at the point in time of the sub-program jump execution, said booking is transferred into the current level "0" after all levels were shifted.

It therefore becomes apparent that in the transfer operation from one register to another one of the 7 program levels, only the first level register "0" is considered to be current. In fact, as a sub-program is ended, the sub-program-end-instruction COSJ causes the return to the first instruction subsequent to the SJ one wherefrom the operation was started, thus restoring as current origin for the time being and as program address for the time being, the contents of the program level register "1."

That is, there is carried out a position shifting operation, as denoted by the solid line arrows in the FIG. 6, on all level registers so that the 3rd level will reside in the 2nd level register, the 4th level will reside in the 3rd level and so forth. This is operated by a microinstruction cycle being reversed with respect to the described one, in order to jump from one subprogram to another. As was said, the subprogram end instruction COSJ causes the restoring of the conditions wherein the equipment executes the instruction being subsequent to the one controlling the jump to the sub-program. Instead of addressing the first instruction subsequent to the one controlling the jump to the sub-program, there exists the ability of addressing the second or the third or the fourth instruction subsequent to the one controlling the jump of the subprogram. This is obtained by the instructions C0 SJ C1 SJ, C2 SJ, C3 SJ respectively adapted to terminate a sub-program as shown in the FIG. 13.

Figure 13:
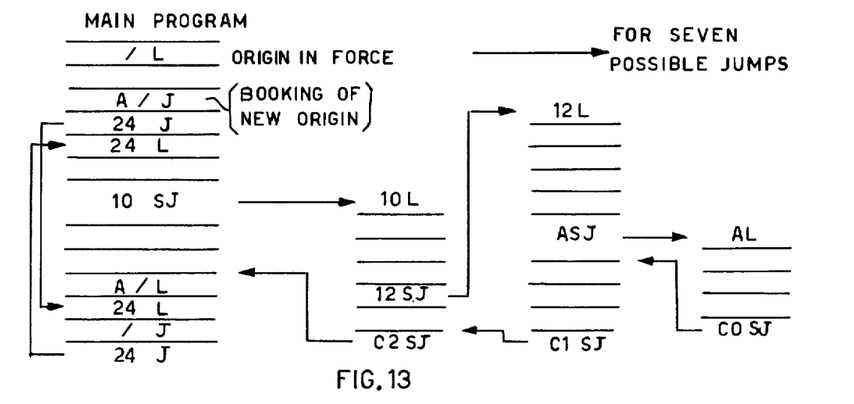
FIG. 13 is a program flow chart.

More particularly, the subroutine AL, recalled by the ASJ jump instruction in the subroutine 12L, ends by executing a CO SJ jump instruction, which commands a re-entry to the subroutine 12L, at the instruction address immediately following the ASJ instruction. When the subroutine 12L terminates, its last instruction CI SJ commands a re-entry to the subroutine 10L by skipping the instruction immediately following the 12 SJ jump instruction in the subroutine 10L from which the subroutine 12L had been recalled. As in turn, also the subroutine 10L terminates, its last instruction C2 SJ commands a re-entry to the main program by skipping two instructions following the jump 10 SJ from which the subroutine 10L has been recalled.

The instruction CZ SJ, wherein Z is variable from 0 to 3, is executed by previously restoring the preceding program levels, namely by a previous shifting operation of all levels to the lower order level. After this, the operand Z of the instruction CZ SJ, which is always present in the register RF of the SP 16, as is every instruction to be executed, is conveyed to the logic unit by the micro-instruction ANI, the operand Y thereof being equal to zero. Here the operand Z of the instruction CZ SJ is checked as to whether it is equal to 0. If not, said operand is decreased by 1 under the control of the microinstruction ADI by addition of the operand Y, equal to IIII, to the register wherein resides the operand Z to be decreased and by neglecting the bit having the carry bit; furthermore, the program addresser is increased by 1 in the arithmetic unit 18 by the microinstruction ADI, and the operand thereof is equal to 0001 in order to locate the instruction being subsequent to the re-entry one. The so decreased operand Z is newly read. Operating in this way, after one, two or three decrements it will finally appear Z = 0 and the addresser will be positioned at the second, third or fourth instruction respectively after the SJ starting instruction.

What I claim is:

1. In an electronic computer receptive of program subroutines including instructions and having a main memory for storing same therein, wherein said memory is sequentially searched for locating a stored instruction:

section defining means responsive to a programmed instruction for defining at least two separate memory sections each having a predetermined initial memory address;

jump means responsive to a second instruction following said programmed instructions for jumping to the first instruction of a subroutine stored in a predetermined one memory section, a booking register conditionable by said section defining means for temporarily storing the initial memory address of said predetermined section, a first memory origin register conditionable by said jump means for storing said temporarily stored initial memory address, and a program addressing register conditionable by said first memory origin register for sequentially addressing the instructions of said predetermined memory section departing from the initial memory address stored in said first memory origin register until said first instruction of subroutine is found.

2. In an electronic computer receptive of program subroutines as in claim 1 further comprising a plurality of successive program level registers each having one portion receptive of memory origin address information and another portion receptive of subroutine re-entry point address information; means responsive to a subroutine jump instruction for shifting the contents of each program level register in one direction to the next successive one and for transferring the contents of the first memory origin register into the one portion of the first program level register and the contents of said program addressing register corresponding to the current subroutine re-entry point address into the other portion of said first program level register; and means responsive to an end-of-a-subroutine instruction for shifting the data in each program level register to the next successive one in the direction opposite to that of said one direction and for transferring the contents of one portion of said first program level register into said memory origin register and the contents of the second portion of said program level register into said program addressing register.

3. In an electronic computer receptive of program subroutines: means for jumping to a stored subroutine therein; and means for re-entering from the jumped-to-subroutine to a desired prior program location said re-entering means including means for storing the desired prior program location and means responsive to a variable operand instruction for skipping a variable number of address location dependent upon the given variable operand.

4. In an electronic computer of the type having a main memory and a scratch pad memory including a first and second pointer registers, an apparatus for compressing a stored program from which at least one instruction has been deleted, said apparatus comprising:

a) means for storing in the second pointer register the address of instruction in the main memory that has been deleted;

b) means for storing in the first pointer register the address of the instruction in the main memory to be shifted;

c) first means when enabled for transferring the first instruction to be shifted from the address indicated by the first pointer register to a given location in the scratch pad memory;

d) second means when enabled for decrementing the first pointer register to the next successive address;

e) third means when enabled for transferring the transferred instruction from the given location in the scratch pad to the main memory at the address indicated by the second pointer;

f) fourth means when enabled for decrementing the second pointer register to the next successive instruction address;

g) means for successively enabling said first means for transferring, said second means for decrementing, said third means for transferring, and said fourth means for decrementing respectively and for repeatedly enabling same in succession until the last instruction in the stored program has been shifted, whereby the stored program is compressed into the least amount of memory space for the number of instruction.

5. In an electronic computer of the type having a main memory and a scratch pad memory, including a first and a second pointer register, an apparatus inserting at least one instruction into a stored program, said apparatus comprising:

a) means for storing in a first given location of the scratch pad memory the instruction to be inserted in the stored program in the main memory;

b) means for storing in the first and second pointer register the address of the first instruction stored in the main memory that is to be shifted;

c) first means when enabled, for transferring the first instruction to be shifted from the location in the main memory indicated by the first pointer register to a second given location in the scratch pad memory;

d) second means when enabled, for decrementing the first pointer register to the next successive instruction address;

e) third means when enabled, for transferring the instruction to be inserted from the first given location in the scratch pad to the location in the main memory indicated by the second pointer register;

f) fourth means when enabled, for transferring the contents of the second given location to the first given location in the scratch pad memory;

g) fifth means when enabled, for decrementing the second pointer register to the next successive instruction address, and h) means for successively enabling said first means, said second means, said third means, said fourth means, said fifth means respectively and for respectively enabling same in succession until the last instruction in the stored program has been shifted, whereby the instruction is inserted and the program takes up only the least amount of memory space for the number of instructions.

* * * * *